United States Patent
Chi et al.

(10) Patent No.: US 9,754,882 B2
(45) Date of Patent: Sep. 5, 2017

(54) INTERCONNECT STRUCTURE HAVING AIR GAP AND METHOD OF FORMING THE SAME

(71) Applicant: Taiwan Semiconductor Manufacturing Company, Ltd., Hsin-Chu (TW)

(72) Inventors: Chih-Chien Chi, Hsin-Chu (TW); Hung-Wen Su, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/156,991

(22) Filed: May 17, 2016

(65) Prior Publication Data

US 2016/0260665 A1 Sep. 8, 2016

Related U.S. Application Data (62) Division of application No. 14/263,901, filed on Apr. 28, 2014, now Pat. No. 9,343,294.

(51) Int. Cl.
*H01L 23/52* (2006.01)
*H01L 23/495* (2006.01)
*H01L 23/48* (2006.01)
*H01L 23/528* (2006.01)
*H01L 21/768* (2006.01)
*H01L 21/02* (2006.01)
(Continued)

(52) U.S. Cl.
CPC ...... *H01L 23/528* (2013.01); *H01L 21/02271* (2013.01); *H01L 21/31111* (2013.01); *H01L 21/7682* (2013.01); *H01L 21/76802* (2013.01); *H01L 21/76831* (2013.01); *H01L 21/76843* (2013.01); *H01L 21/76877* (2013.01); *H01L 23/5222* (2013.01); *H01L 23/5329* (2013.01); *H01L 23/53295* (2013.01); *H01L 23/53223* (2013.01); *H01L 23/53238* (2013.01); *H01L 2924/0002* (2013.01)

(58) Field of Classification Search
CPC ............. H01L 23/528; H01L 21/02271; H01L 21/31111; H01L 21/76802; H01L 21/76831; H01L 21/76843; H01L 21/76877; H01L 23/5222; H01L 23/5329; H01L 23/53223; H01L 23/53238; H01L 23/53295; H01L 2924/0002
USPC .................. 257/211, 666, 758; 438/619, 624
See application file for complete search history.

(56) References Cited

U.S. PATENT DOCUMENTS

5,837,618 A 11/1998 Avanzino et al.
6,071,805 A 6/2000 Liu
(Continued)

*Primary Examiner* — Dzung Tran
(74) *Attorney, Agent, or Firm* — Slater Matsil, LLP (57) ABSTRACT

A representative semiconductor device includes a first dielectric layer overlying a substrate, at least a first opening in the first dielectric layer, a conformal dense layer lining the at least first opening in the first dielectric layer, a barrier layer overlying the conformal dense layer, a conductive feature in the at least first opening, where a portion of the first dielectric layer between any two adjacent conductive features is removed to form a second opening, the second opening exposing the conformal dense layer between the two adjacent conductive features, and a second dielectric layer having an air gap formed therein, the second dielectric layer disposed between the two adjacent conductive features.

20 Claims, 5 Drawing Sheets

(51) Int. Cl.
*H01L 23/522* (2006.01)
*H01L 21/311* (2006.01)
*H01L 23/532* (2006.01)

(56) References Cited

U.S. PATENT DOCUMENTS

| | | | |
|---|---|---|---|
| 2001/0051423 A1* | 12/2001 | Kim | H01L 21/7682 438/624 |
| 2004/0180510 A1 | 9/2004 | Ranade et al. | |
| 2006/0148253 A1 | 7/2006 | Chung et al. | |
| 2006/0243599 A1 | 11/2006 | Shih et al. | |
| 2007/0178713 A1 | 8/2007 | Jeng | |
| 2007/0246831 A1* | 10/2007 | Gabric | H01L 21/7682 257/758 |
| 2008/0174017 A1* | 7/2008 | Yang | H01L 21/7682 257/751 |
| 2009/0115061 A1* | 5/2009 | Chen | H01L 21/76807 257/751 |
| 2009/0278237 A1 | 11/2009 | Cooney, III et al. | |
| 2010/0130001 A1* | 5/2010 | Noguchi | H01L 21/76811 438/627 |
| 2012/0187566 A1* | 7/2012 | Horak | H01L 21/7682 257/774 |

* cited by examiner

INTERCONNECT STRUCTURE HAVING AIR GAP AND METHOD OF FORMING THE SAME

PRIORITY CLAIM

This application is a divisional of U.S. patent application Ser. No. 14/263,901 filed on 28 Apr. 2014, entitled "Interconnect Structure having Air Gap and Method of Forming Same," which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of a feature is scaled down, the feature may have a high aspect ratio (the ratio of the height vs. width of the feature). When the high aspect ratio reaches a critical value, the feature may actually collapse or fall down during the fabrication process. Accordingly, what is needed is a method for preventing this from happening.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
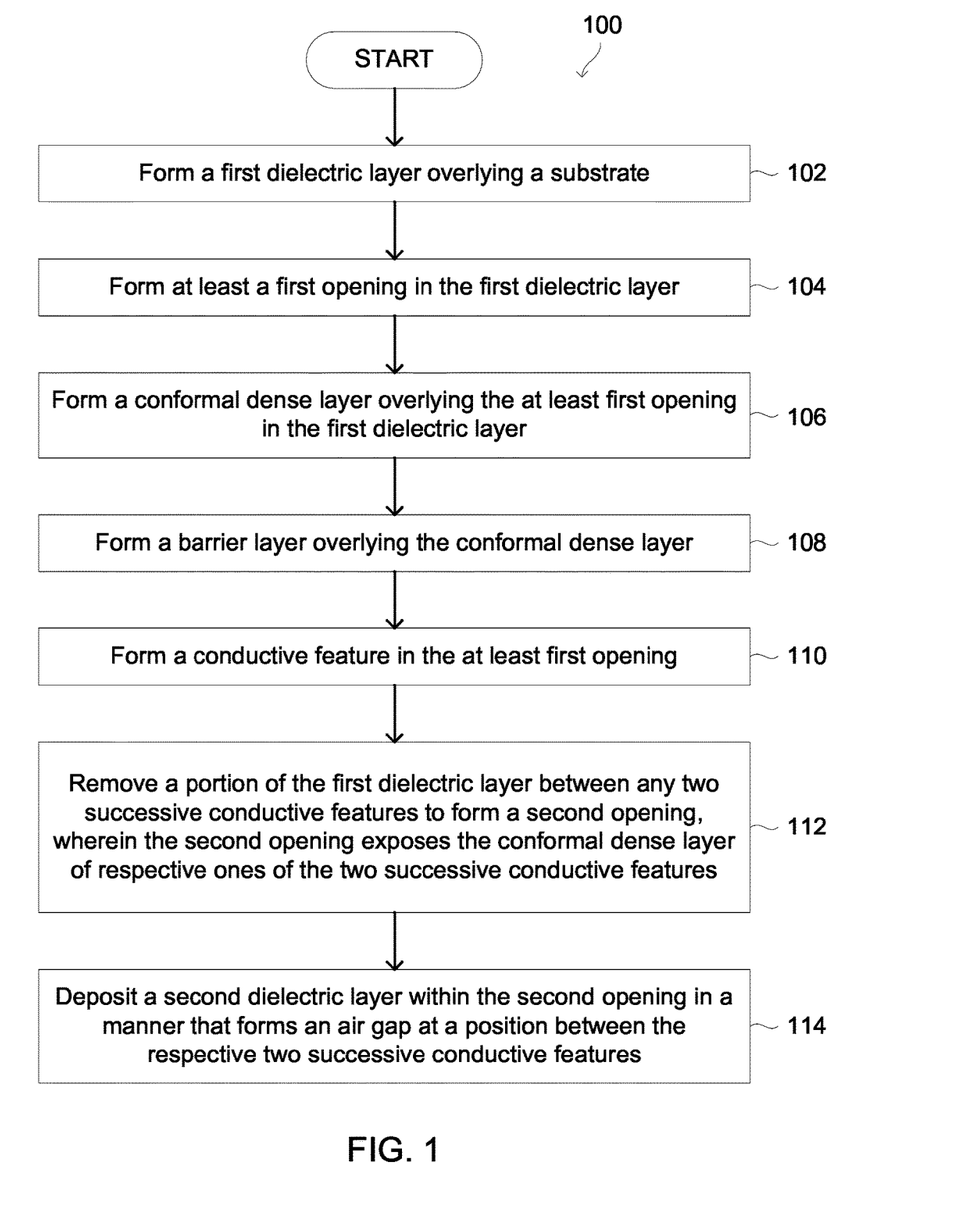
FIG. 1 is a flowchart illustrating a method for fabricating a semiconductor device comprising an interconnect according to various aspects of the present disclosure.

FIG. 1 is a flowchart illustrating a method 100 for fabricating a semiconductor device 200 according to various aspects of the present disclosure. FIGS. 2-8 show schematic cross-sectional views of a semiconductor device 200 at various stages of fabrication according to an embodiment of the method 100 of FIG. 1. The semiconductor device 200 may be included in a microprocessor, a memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing, for example. Accordingly, it is understood that additional processes may be provided before, during, and/or after the method 100 of FIG. 1, and that some other processes may only be briefly described herein. Also, FIGS. 1 through 8 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
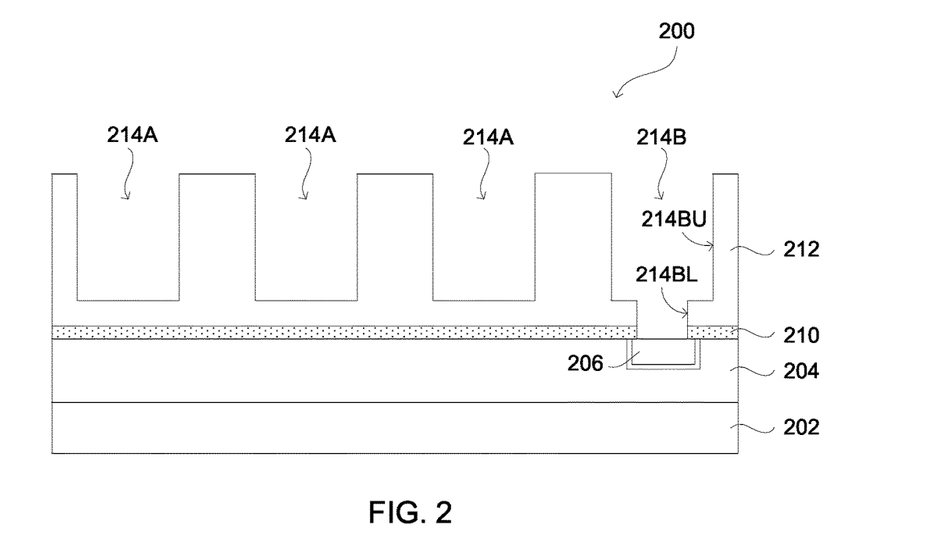
FIGS. 2-8 show schematic cross-sectional views of an interconnect structure of a semiconductor device at various stages of fabrication according to various aspects of the present disclosure.

Referring to FIGS. 1 and 2, the method 100 begins at step 102 wherein a dielectric layer 204 is formed over a substrate 202. In some embodiments, an etch stop layer 210 is formed over the dielectric layer 204 and under a dielectric layer 212. The substrate 202 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate may be doped with a p-type dopant, such as boron, aluminum, gallium, or the like, although the substrate may alternatively be doped with an n-type dopant, as is known in the art.

The substrate 202 may include active and passive devices (not shown). As one of ordinary skill in the art will recognize, a wide variety of devices such as transistors, capacitors, resistors, inductors, combinations of these, and the like may be used to generate the structural and functional requirements of the design for the semiconductor device 200. Only a portion of the substrate 202 is illustrated in the figures, as this is sufficient to fully describe the illustrative embodiments.

A dielectric layer 204 is formed over the substrate 202. The dielectric layer 204 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 204 may be deposited by chemical vapor deposition (CVD), physical vapor deposition (PVD), atomic layer deposition (ALD), a spin-on-dielectric (SOD) process, the like, or a combination thereof. In an embodiment, the dielectric layer 204 is formed directly on a top surface of the substrate 202. In other embodiments, the dielectric layer 204 is formed on intermediate layers and/or structures (not shown) which are on substrate 202. In some embodiments, the dielectric layer 204 is an inter-layer dielectric (ILD). In some embodiments, a metallization layer such as metal layer 206 is formed in and/or on the dielectric layer 204 for interconnecting to an upper metallization layer (see conductive feature 218 of FIG. 5).

In some embodiments, the etch stop layer 210 functions for controlling the end point during subsequent etching processes. In some embodiments, the etch stop layer 210 is formed of silicon oxide, silicon nitride, silicon carbide, silicon oxynitride or combinations thereof. In some embodiments, the etch stop layer 210 has a thickness of about 10 angstroms to about 3,000 angstroms. The etch stop layer 210 is formed through any of a variety of deposition techniques, including LPCVD (low-pressure chemical vapor deposition), APCVD (atmospheric-pressure chemical vapor deposition), PECVD (plasma-enhanced chemical vapor deposition), physical vapor deposition (PVD), sputtering, and future-developed deposition procedures.

The dielectric layer 212 may be a single layer or a multi-layered structure. In some embodiments, the dielectric layer 212 has a thickness that varies with the applied technology, for example a thickness of about 800 angstroms to about 30,000 angstroms. In some embodiments, the dielectric layer 212 is silicon oxide, carbon-doped silicon oxide, a comparatively low dielectric constant (k value) dielectric material with a k value less than about 4.0, or combinations thereof. In some embodiments, the dielectric layer 212 is formed of a material, including low-k dielectric material, extreme low-k dielectric material, porous low-k dielectric material, and combinations thereof. A wide variety of low-k materials may be employed in accordance with embodiments, for example, spin-on inorganic dielectrics, spin-on organic dielectrics, porous dielectric materials, organic polymer, organic silica glass, FSG, HSQ (hydrogen silsesquioxane) series material, MSQ (methyl sisesquioxane) series material, or porous organic series material. In some embodiments, the dielectric layer 212 is deposited through any of a variety of techniques, such as CVD, PVD, ALD, remote plasma enhanced CVD (RPECVD), liquid source misted chemical deposition (LSMCD), coating, spin-coating or another process that is adapted to form a thin film layer over the substrate.

In embodiments, the dielectric layer 212 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 212 is a silicon-containing and nitrogen-containing dielectric layer. In another embodiment, the dielectric layer 212 a silicon-containing, nitrogen-containing, and carbon-containing dielectric layer.

Still referring to FIGS. 1 and 2, the method 100 proceeds to step 104 wherein recess cavities 214A and 214B are formed in the dielectric layer 212 of semiconductor device 200. Recess cavities 214A are representative single damascene openings, whereas recess cavity 214B is a representative dual damascene opening including an upper trench section 214BU and a lower via-hole section 214BL patterned in the dielectric layer 212 and the etch stop layer 210 to define a contact region in the dielectric layer 204. Although the embodiments illustrate both single and dual damascene openings in the dielectric layer 212, the use of single damascene openings or the use of dual damascene openings in the dielectric layer also provide value. In dual damascene techniques including "via-first" patterning method or a "trench-first" patterning method, the upper trench section 214BU and the lower via-hole section 214BL may be formed using a typical lithographic with masking technologies and anisotropic etch operation (e.g., plasma etching or reactive ion etching).

Figure 3:
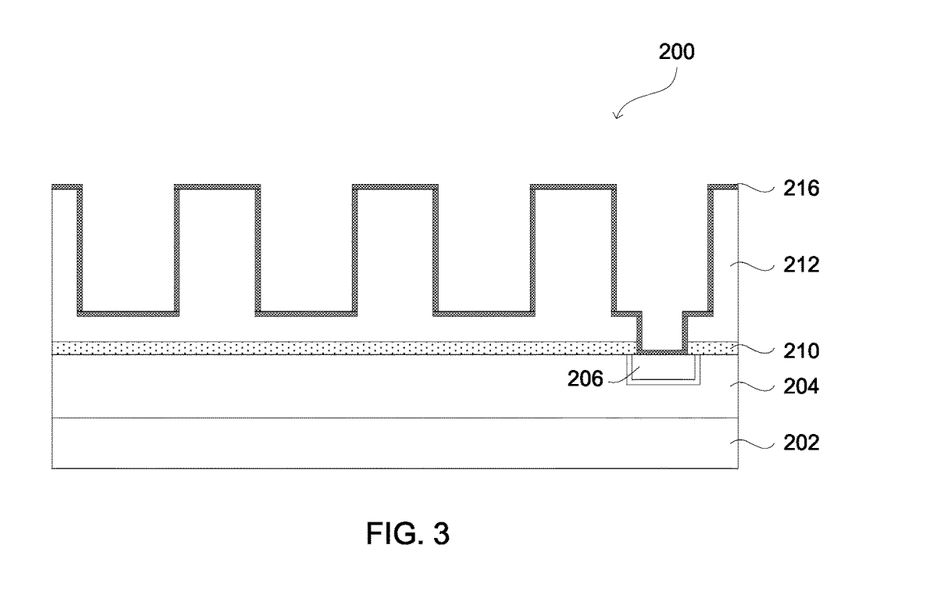

Referring to FIGS. 1 and 3, the method 100 proceeds to step 106 wherein a dense layer 216 (e.g., dielectric liner) is conformally deposited to line the sidewalls and bottoms of the recess cavities 214A, the upper trench section 214BU and the lower via hole section 214BL of recess cavity 214B and over the dielectric layer 212. The dense layer 216 is configured to provide structural support to metal interconnect features, such as conductive features 218 (see FIG. 7). The structural support prevents the conductive features 218, which may have a weak structural integrity due to their small size (e.g., having widths of less than 50 nm), from collapsing during subsequent processing. This is especially true of semiconductor devices having air gaps. For example, during a subsequent etching process to form air gaps in the semiconductor device 200 (see FIG. 8), the dense layer 216 prevents conductive features 218 from easily distorting due to poor sidewall support and/or weak foundation thus avoiding short circuit and/or defect concerns. In some embodiments, the dense layer 216 prevents barrier layer damage that may otherwise occur without such support and/or protection (see FIG. 7).

The dense layer 216 comprises a material sufficiently dense to support metal interconnect features from collapsing during subsequent processing, such as dense dielectric materials and ceramics. In some embodiments, the dense layer 216 comprises a material having a dielectric constant (K value) greater than about 2.5. In other embodiments, the dense layer 216 comprises a dielectric material having a dielectric constant (K value) in a range from about 2.5 to about 6.0. In some embodiments, the dense layer 216 comprises silicon oxide, $SiO_2$, SiC, SiOxCyHz, $Al_2O_3$, borophosphosilicate glass (BPSG), undoped silicate glass (USG), fluorinated silicate glass (FSG), or combinations thereof.

In some embodiments, the dense layer 216 is conformally deposited in the recess cavities 214A and 214B by chemical vapor deposition (CVD), atomic layer deposition (ALD), plasma-enhanced chemical vapor deposition (PECVD), low-pressure CVD (LPCVD), plasma-enhanced ALD (PEALD), combinations thereof, or other well-known conformal deposition techniques. In some embodiment, the dense layer 216 is deposited using a thermal treatment process with a gas soak or without gas (e.g., in a vacuum). For example, a thermal process can be performed at a temperature of about 25 degrees Celsius to about 500 degrees Celsius and under pressure from about 1 mTorr to about 100 mTorr. In some embodiments, the treatment is a plasma process using Ar, H2, NH3, or combinations thereof, for example at a flow rate of about 1 sccm to about 10000 sccm at a pressure of about 1 mTorr to about 100 Torr, at a power of about 10 watts to about 1000 watts and at a temperature of about 25 degrees Celsius to about 400 degrees Celsius. The dense layer 216 is conformally deposited to avoid a gap filling issue during a subsequent opening filing process. In some embodiments, the dense layer has a thickness ranging from about 5 angstroms to about 1,000 angstroms.

Figure 4:
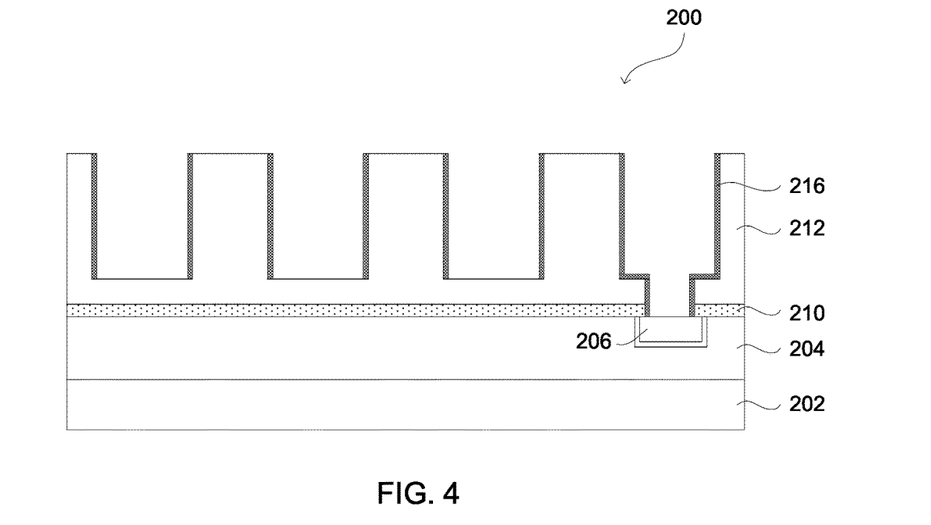

In some embodiments to improve the via resistance of the metal interconnect features an optional etching process is performed to remove a portion of the dense layer 216 at the bottom surface of recess cavities 214A and 214B, as shown in FIG. 4. In some embodiments, the dense layer 216 may be removed by an anisotropic etch process.

Figure 5:
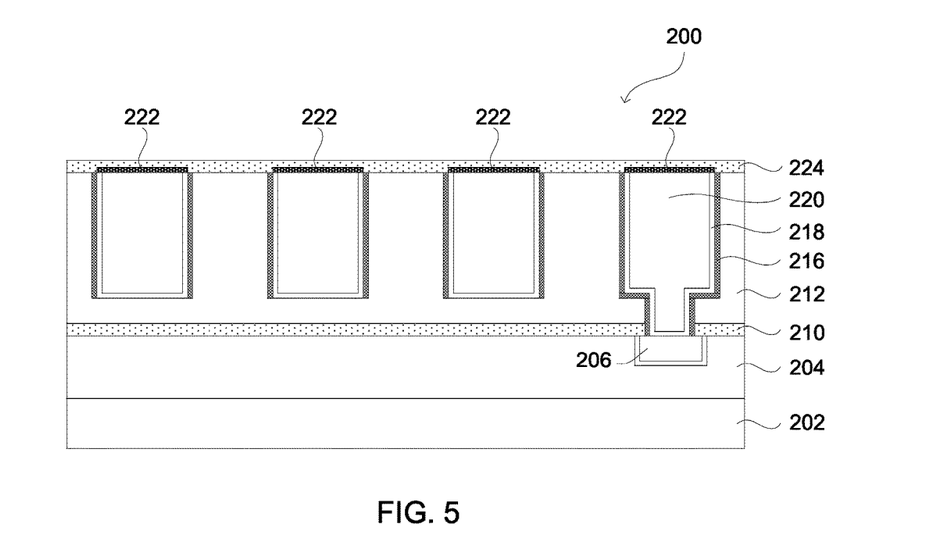

Referring to FIGS. 1 and 5, the method 100 proceeds to step 108 wherein a barrier layer 218 is formed on the bottom of the recess cavities 214A and 214B and on the sidewalls of the conformal dense layer 216. The barrier layer 218 helps to block diffusion of the subsequently formed conductive features 220 into adjacent dielectric materials such as the dielectric layer 212. The barrier layer 218 may be formed of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO), the like, or combinations thereof. The barrier layer 218 may be formed by CVD, PVD, plasma-enhanced CVD (PECVD), ALD, SOD, the like, or a combination thereof. In some embodiments, the barrier layer 218 may be omitted.

After the barrier layer 218 is formed in the recesses, the method 100 proceeds to step 110, wherein the conductive features 220 are formed on the barrier layer 218 in the recesses. In an embodiment, the conductive features 220 are conductive lines. The conductive lines may be a part of a metal layer MN and may be in the first metal layer (M1) over the substrate 202 or may be any number of metal layer over the substrate 202 (e.g., M5, M10, M100). The conductive features 220 may be formed of copper, aluminum, the like, or a combination thereof. The conductive features 220 may be formed through a deposition process such as electrochemical plating (ECP), CVD, PVD, the like, or a combination thereof. In some embodiments, the conductive features 220 may be formed on a seed layer (not shown), such as titanium copper alloy. In an embodiment, the conductive features 220 are formed to a thickness from about 100 angstroms to about 20,000 angstroms.

In some embodiments, the conductive features 220 are planarized by a chemical mechanical polish (CMP) process or an etching process. In these embodiments, the conductive features 220 have a top surface that are substantially coplanar with a top surface of the dielectric layer 212. Although FIG. 5 illustrates 4 conductive features, three formed in single damascene openings and one formed in a dual damascene opening, one skilled in the art understands that the semiconductor device 200 may have any number and any type of conductive features depending on the design requirements.

In some embodiments, an optional capping layer 222 is formed over the conductive features 220. The capping layers 222 (e.g., forming capping features) disposed over the conductive features 220 and the barrier layers 218 improve electromigration characteristics of the conductive features 220 and the barrier layers 218. In some embodiments, the capping layer 222 has a thickness ranging from about 5 angstroms to about 1,000 angstroms and may be formed by a deposition process including low-pressure CVD (LP-CVD), CVD, PECVD, plasma-enhanced ALD (PEALD), PVD, sputtering, the like, or a combination thereof. In an embodiment, a top surface of the capping layer 222 is substantially higher than a top surface of the conductive feature 220.

The capping layer 222, for example, is a metal-containing layer. In some embodiments, the capping layer 222 includes Co, Cu, W, Al, Mn, Ru, the like, or combinations and alloys thereof. In some embodiments, the capping layer 222 is selectively formed on the conductive features 220 and barrier layers 218. In other embodiments, the capping layer 222 is formed entirely over the semiconductor device 200 and then subjected to a patterning process to remove the portions of the capping layer 222 on the dielectric layer 212, while leaving another portion of the capping layer 222 on the conductive features 220 and the barrier layer 218.

Still referring to FIG. 5, an etch stop layer 224 is deposited over the capping layers 222, the conductive features 220, the dense layer 216, the barrier layer 218, and the dielectric layer 212. The etch stop layer 224 acts as an etch stop layer for the subsequent formation of metallization layers to the conductive features 220. The etch stop layer 224 may be made of one or more suitable dielectric materials such as silicon oxide, silicon carbide, oxygen doped silicon carbide, nitrogen doped silicon carbide, silicon nitride, aluminum oxide, aluminum nitride, aluminum oxynitride, combination of these, or the like. The etch stop layer 224 may be deposited through a process such as CVD, an SOD process, although any acceptable process may be utilized to form the etch stop layer 224.

Figure 6:
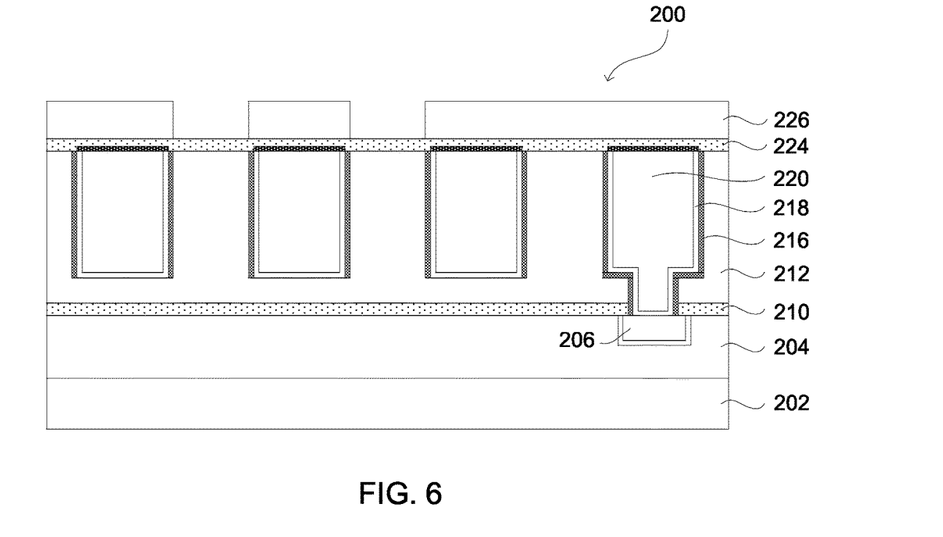
Figure 7:
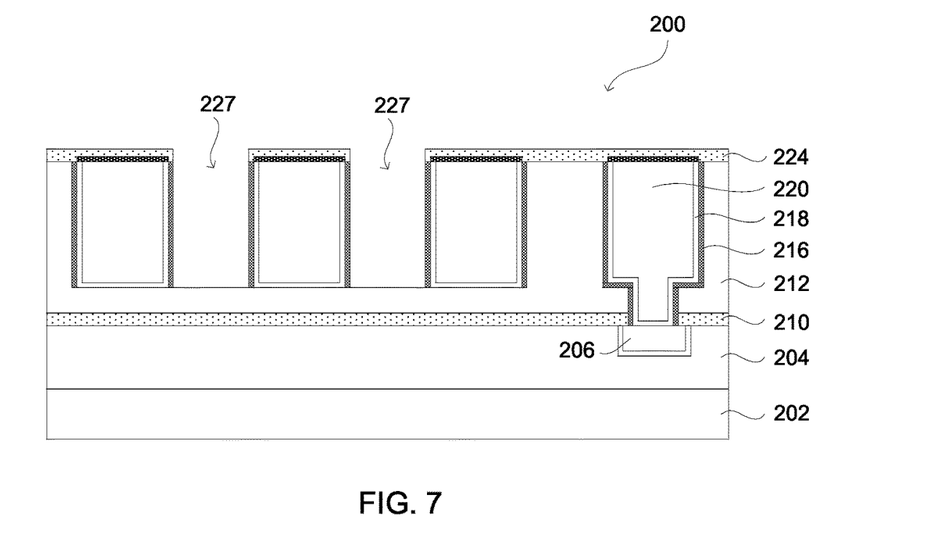

Referring to FIGS. 1 and 7, the method 100 proceeds to step 112 wherein a portion of the dielectric layer 212 between conductive features 220 is removed to form an opening 227 (e.g., removed portion of dielectric layer 212), wherein the opening 227 exposes respective portions of the conformal dense layer 216. Opening 227 may be formed using, for example, photolithography techniques. Generally, photolithography techniques involve depositing a photoresist material (not shown), which is subsequently irradiated (exposed) and developed to remove a portion of the photoresist material corresponding to the opening 227. The remaining photoresist material protects the underlying material from subsequent processing steps, such as etching. Other layers may be used in the patterning process to form opening 227. For example, one or more hard mask layers may be used. FIG. 6 shows an example of a patterned photoresist layer or mask 226 for forming opening 227. Although opening 227 may be formed by patterned photoresist material and hard mask layers, any suitable process to expose portions of the dielectric layer 212 to form opening 227 may be used.

Figure 8:
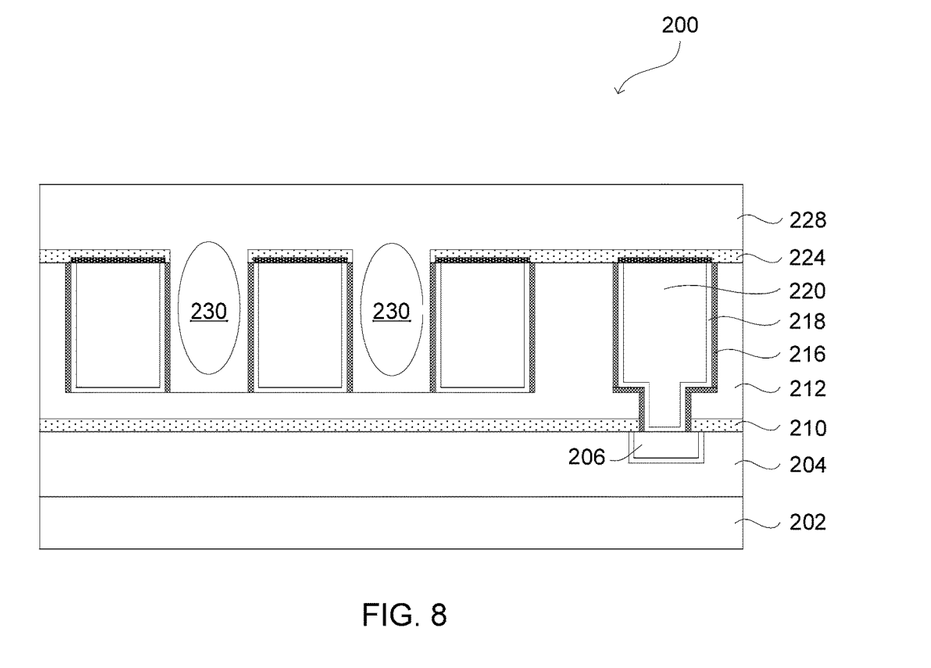

Referring to FIGS. 1 and 8, the method 100 proceeds to step 114 wherein a dielectric layer 228 is deposited over the substrate 202 in the openings 227 in a manner that forms an air gap 230 at a position between any two conductive features 220. The dielectric layer 228 may be formed of oxides such as silicon oxide, BPSG, USG, FSG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 228 may be deposited by CVD, PVD, ALD, an SOD process, the like, or a combination thereof. In some embodiments, the dielectric layer 228 is an ILD. In some embodiments, the dielectric layer 228 is formed within at least one of the openings 227. In some embodiments, by applying an energy to the dielectric layer 228 a portion of the dielectric layer 228 is removed, resulting in air gaps 230. The energy applied to the dielectric layer 228 includes ultraviolet (UV), X-ray, infrared, visual light, thermal energy, electron-beam (e-beam), and/or other proper energy sources. One exemplary energy source applied to the dielectric layer 228 includes e-beam source with electron energy ranging between about 100 eV and about 500 KeV. The energy applied to the dielectric layer 228 may have a certain duration in combination with a certain type of energy so that the dielectric layer 228 can be partially removed to form air gaps 230. In one embodiment, thermal energy is implemented with a temperature ranging between about 100 Celsius and about 600 Celsius and/or a duration from about 1 minute to about 20 minutes. In another embodiment, ultraviolet energy is implemented with a temperature ranging between about 100 Celsius and about 600 Celsius and/or a duration from about 1 minute to about 10 minutes. Air gaps 230 are substantially formed in the dielectric layer 228 within regions defined by any two proximate conductive features 218. In some embodiments, capacitive coupling is reduced in the semiconductor device 200 as a result of the formation of at least one air gap in the device.

Further processing may be performed. For example, additional dielectric layers and metallization layers may be formed to interconnect various elements, contact pads and passivation layers may be formed, and the like to complete the semiconductor device 200.

Advantages of one or more embodiments of the present disclosure may include one or more of the following.

In one or more embodiments, the dense layer provides structural support that prevents conductive metal lines, which may have a weak structural integrity due to their small size, poor sidewall support, and/or weak foundation, from collapsing during subsequent processing.

In one or more embodiments, the dense layer prevent barrier layer damage that may otherwise occur without such support and/or protection.

In one or more embodiments, by eliminating distorted metal lines and damaged barrier layers, short circuit and defect concerns may be avoided thus improving device reliability.

Various aspects of the present disclosure have been described. According to one aspect of this description, a method for forming a semiconductor device includes forming a first dielectric layer overlying a substrate, forming at least a first opening in the first dielectric layer, forming a conformal dense layer lining the at least first opening in the first dielectric layer, forming a barrier layer overlying the conformal dense layer, forming a conductive feature in the at least first opening, removing a portion of the first dielectric layer between any two adjacent conductive features to form a second opening, wherein the second opening exposes the conformal dense layer between the two adjacent conductive features, and depositing between the two adjacent conductive features a second dielectric layer having an air gap formed therein.

According to another aspect of this description, a method for forming an interconnect structure includes forming first and second openings in a first dielectric layer overlying a substrate, forming a conformal dense layer on the sidewalls of the first and second openings, forming a barrier layer at the bottom and sidewalls of the first and second openings, filling the first and second openings with a conductive layer to form first and second conductive features, respectively, removing a portion of the first dielectric layer between the first and second conductive features to form a third opening, wherein the third opening exposes the conformal dense layer between the first and second conductive features, and depositing a second dielectric layer having an air gap between the first and second conductive features.

According to yet another aspect of this description, a semiconductor device includes a metal interconnect layer having first and second conductive features within a dielectric layer overlying a substrate, a barrier layer disposed between respective ones of the first and second conductive features and the dielectric layer, a conformal dense layer along sidewalls of the barrier layer and the dielectric layer, and an air gap disposed within the dielectric layer at a position between the first and second conductive features of the metal interconnect layer.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A semiconductor device, comprising:
    a metal interconnect layer having a first conductive feature and a second conductive feature within a first dielectric layer overlying a substrate;
    a barrier layer disposed between respective ones of the first conductive feature, the second conductive feature, and the first dielectric layer;
    a conformal dense layer along sidewalls of the barrier layer and the first dielectric layer;
    an etch stop layer over the first dielectric layer;
    a second dielectric layer over and extending through the etch stop layer; and
    an air gap disposed within the second dielectric layer between the first conductive feature and the second conductive feature.

2. The semiconductor device of claim 1, wherein the conformal dense layer comprises a dielectric material having a dielectric constant (k value) greater than 2.5.

3. The semiconductor device of claim 1, wherein the conformal dense layer comprises a dielectric material having a dielectric constant (k value) in a range from about 2.5 to about 6.0.

4. The semiconductor device of claim 1, wherein the conformal dense layer has a thickness ranging from about 5Å to about 1,000 Å.

5. The semiconductor device of claim 1, wherein the conformal dense layer comprises silicon oxide, $SiO_2$, SiC, SiOxCyHz, $Al_2O_3$, borophosphosilicate glass (BPSG), undoped silicate glass (USG), fluorinated silicate glass (FSG), or combinations thereof.

6. The semiconductor device of claim 1, further comprising a first capping feature over the first conductive feature.

7. The semiconductor device of claim 6, further comprising a second capping feature over the second conductive feature.

8. The semiconductor device of claim 1, further comprising an etch stop layer over the first conductive feature, the second conductive feature, the conformal dense layer, and the barrier layer.

9. A semiconductor device, comprising:
    first and second openings in a first dielectric layer overlying a substrate;

a conformal dense layer on sidewalls of the first and second openings;

a barrier layer at a bottom surface and sidewalls of the first and second openings;

first and second conductive features in first and second openings, respectively;

a third opening in the first dielectric layer between the first and second conductive features, wherein the third opening exposes the conformal dense layer between the first and second conductive features;

an etch stop layer over the first dielectric layer, wherein the third opening extends through the etch stop layer; and a second dielectric layer over the etch stop layer, wherein the second dielectric layer extends into the third opening and comprises an air gap disposed between the first and second conductive features.

10. The semiconductor device of claim 9, wherein the conformal dense layer comprises a dielectric material having a dielectric constant (k value) greater than 2.5.

11. The semiconductor device of claim 9, wherein the conformal dense layer comprises a dielectric material having a dielectric constant (k value) in a range from about 2.5 to about 6.0.

12. The semiconductor device of claim 9, wherein the conformal dense layer has a thickness ranging from about 5Å to about 1,000 Å.

13. The semiconductor device of claim 9, wherein the conformal dense layer comprises silicon oxide, $SiO_2$, SiC, $SiO_xC_yH_z$, $Al_2O_3$, borophosphosilicate glass (BPSG), undoped silicate glass (USG), fluorinated silicate glass (FSG), or combinations thereof.

14. The semiconductor device of claim 9, further comprising a capping layer over the first conductive feature and the second conductive feature.

15. The semiconductor device of claim 9, wherein the etch stop layer is disposed directly over the first conductive feature, the second conductive feature, the conformal dense layer, and the barrier layer.

16. A semiconductor device, comprising:

a first dielectric layer having a first and second trench therein;

a dielectric liner lining the first trench and the second trench, the dielectric liner having a dielectric constant (k value) in a range of about 2.5 to about 6.0;

a first conductor and a second conductor in the first trench and the second trench, respectively;

an etch stop layer over the first conductor, the second conductor, and the dielectric liner;

an opening in the first dielectric layer between the first conductor and the second conductor, the opening exposing respective portions of the dielectric liner lining the first trench and the dielectric liner lining the second trench, the opening further exposing a sidewall of the etch stop layer; and a second dielectric layer over the etch stop layer, the second dielectric layer having an air gap therein between the first conductor and the second conductor.

17. The semiconductor device of claim 16, wherein the dielectric liner comprises silicon oxide, $SiO_2$, SiC, $SiO_xC_yH_z$, $Al_2O_3$, borophosphosilicate glass (BPSG), undoped silicate glass (USG), fluorinated silicate glass (FSG), or combinations thereof.

18. The semiconductor device of claim 16, wherein each of first conductor and the second conductor comprise:

a barrier layer on the dielectric liner; and a conductive material, the barrier layer disposed along sidewalls and a bottom surface of the conductive material.

19. The semiconductor device of claim 18, further comprising a capping layer on the conductive material.

20. The semiconductor device of claim 9, wherein the air gap extends above the etch stop layer.

* * * * *